US009379243B1

(12) United States Patent
Hashemi et al.

(10) Patent No.: US 9,379,243 B1
(45) Date of Patent: Jun. 28, 2016

(54) FIELD-EFFECT TRANSISTOR WITH AGGRESSIVELY STRAINED FINS

(71) Applicant: International Business Machines Corporation, Armonk, NY (US)

(72) Inventors: Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/625,917

(22) Filed: Feb. 19, 2015

(51) Int. Cl.
  *H01L 29/78* (2006.01)
  *H01L 21/02* (2006.01)
  *H01L 21/762* (2006.01)
  *H01L 27/092* (2006.01)

(52) U.S. Cl.
  CPC ...... *H01L 29/7849* (2013.01); *H01L 21/02381* (2013.01); *H01L 21/02532* (2013.01); *H01L 21/76224* (2013.01); *H01L 27/0924* (2013.01)

(58) Field of Classification Search
  None
  See application file for complete search history.

(56) References Cited

U.S. PATENT DOCUMENTS

| 7,141,820 B2 | 11/2006 | Lee et al. |
| 7,728,387 B1 | 6/2010 | Krishnamohan et al. |
| 7,799,592 B2* | 9/2010 | Lochtefeld ........ H01L 29/66795 257/185 |
| 2012/0161203 A1 | 6/2012 | Flachowsky et al. |
| 2013/0034943 A1* | 2/2013 | Lochtefeld ........ H01L 29/66795 438/299 |
| 2013/0099282 A1* | 4/2013 | Chen ................. H01L 29/66795 257/190 |
| 2013/0334571 A1 | 12/2013 | Reznicek et al. |
| 2014/0070277 A1 | 3/2014 | Adam et al. |
| 2014/0239347 A1* | 8/2014 | van Dal ............... H01L 29/0688 257/192 |
| 2015/0318176 A1* | 11/2015 | Qi ..................... H01L 21/26513 438/283 |

FOREIGN PATENT DOCUMENTS

| JP | 2005210062 A | 8/2005 |
| WO | 03015142 A2 | 2/2003 |
| WO | 03015142 A3 | 2/2003 |

OTHER PUBLICATIONS van Dal, M.J.H.; Vellianitis, G.; Duriez, B.; Doornbos, G.; Chih-Hua Hsieh; Bi-Hui Lee; Kai-Min Yin; Passlack, M.; Diaz, C.H., "Germanium p-Channel FinFET Fabricated by Aspect Ratio Trapping," in Electron Devices, IEEE Transactions on, vol. 61, No. 2, pp. 430-436, Feb. 2014.*

* cited by examiner

*Primary Examiner* — Joseph Schoenholtz
(74) *Attorney, Agent, or Firm* — Daniel R. Simek

(57) ABSTRACT

In a method for fabricating a field-effect transistor (FET) structure, forming a shallow trench isolation (STI) structure on a semiconductor substrate, wherein the STI structure includes dielectric structures that form one or more dielectric walled aspect ratio trapping (ART) trenches. The method further includes epitaxially growing a first semiconductor material on the semiconductor substrate and substantially filling at least one of the one or more ART trenches, and recessing the first semiconductor material down into the ART trenches selective to the dielectric structures, such that the upper surface of the first semiconductor material is below the upper surface of the dielectric structures. The method further includes epitaxially growing a second semiconductor material on top of the first semiconductor material and substantially filling the ART trenches to form a semiconductor fin that comprises an upper portion comprising the second semiconductor material and a lower portion comprising the first semiconductor material.

18 Claims, 4 Drawing Sheets

FIELD-EFFECT TRANSISTOR WITH AGGRESSIVELY STRAINED FINS

BACKGROUND

The present invention relates generally to the field of semiconductor devices, and more particularly to a field-effect transistor structure with aggressively strained fins.

Field-effect transistors (FETs) can be semiconductor devices fabricated on a bulk semiconductor substrate or on a silicon-on-insulator (SOI) substrate. FET devices generally consist of a source, a drain, a gate, and a channel between the source and the drain. The gate is separated from the channel by a thin insulating layer, typically of silicon oxide, called the gate oxide. A voltage applied between the source and gate induces an electric field that modulates the conductivity of the channel between the source and the drain thereby controlling the current flow between the source and the drain. Current integrated circuit designs use complementary metal-oxide-semiconductor (CMOS) technology that use complementary and symmetrical pairs of p-type and n-type metal oxide semiconductor field-effect transistors (MOSFETs) for logic functions.

Silicon-germanium (SiGe) is a general term for the alloy $Si_{1-x}Ge_x$, which consists of any molar ratio of silicon (Si) and germanium (Ge). SiGe can be used as a semiconductor material in integrated circuits as a strain-inducing layer for CMOS transistors. SiGe is manufactured on silicon wafers using conventional silicon processing toolsets.

SUMMARY

One aspect of the present invention discloses a method for fabrication of a field-effect transistor (FET) structure. The method includes forming a shallow trench isolation (STI) structure on a semiconductor substrate, wherein the STI structure includes dielectric structures on the semiconductor substrate that form one or more dielectric walled aspect ratio trapping (ART) trenches. The method further includes epitaxially growing a first semiconductor material on the semiconductor substrate and substantially filling at least one of the one or more dielectric walled ART trenches such that an upper surface of the first semiconductor material is substantially flush with an upper surface of the dielectric structures. The method further includes recessing the first semiconductor material down into the one or more dielectric walled ART trenches selective to the dielectric structures, such that the upper surface of the first semiconductor material is below the upper surface of the dielectric structures. The method further includes epitaxially growing a second semiconductor material on the upper surface of the first semiconductor material and substantially filling the one or more dielectric walled ART trenches to form a semiconductor fin that comprises an upper portion comprised of the second semiconductor material and a lower portion comprised of the first semiconductor material.

Another aspect of the present invention discloses a field-effect transistor (FET) structure. The FET structure comprises a set of two oxide structures on a semiconductor substrate. The FET structure further comprises a fin on the semiconductor substrate between the set of two oxide structures, wherein the fin is comprised of a lower portion comprised of a first semiconductor material on the semiconductor substrate, and wherein the fin is comprised of an upper portion comprised of a second semiconductor material on the first semiconductor material lower portion.

BRIEF DESCRIPTION OF THE DRAWINGS

The following detailed description, given by way of example and not intended to limit the disclosure solely thereto, will best be appreciated in conjunction with the accompanying drawings, in which.

DETAILED DESCRIPTION

Figure 1:
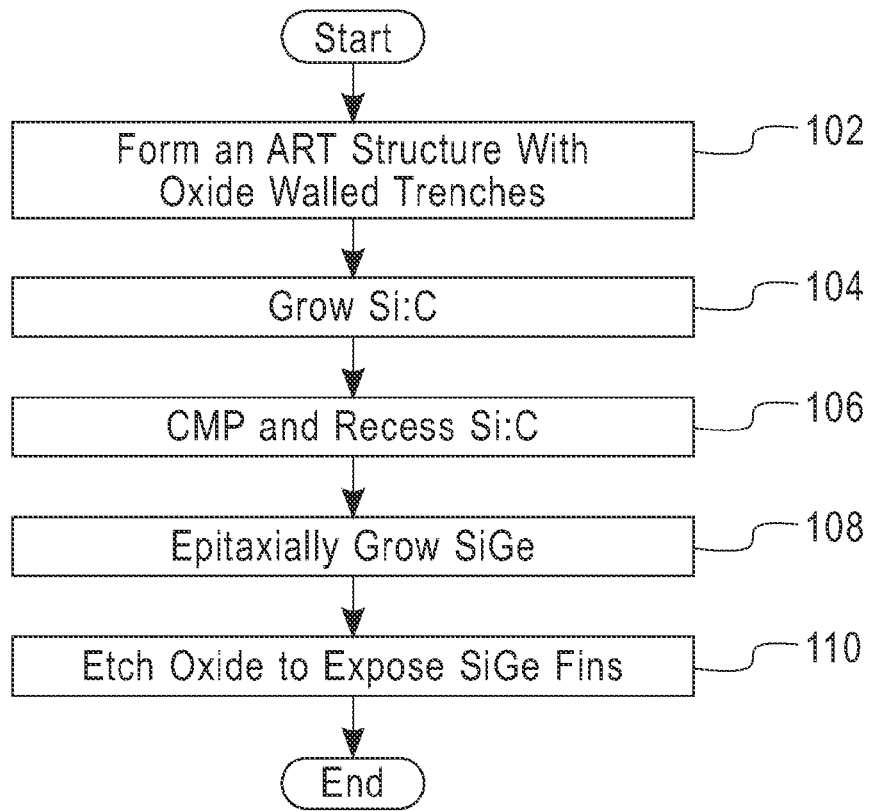
FIG. 1 depicts a flowchart illustrating an exemplary method of fabricating a field-effect transistor (FET) structure, in accordance with embodiments of the present invention.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative and not restrictive. Further, the Figures are not necessarily to scale, some features may be exaggerated to show details of particular components. Therefore, specific structural and functional details disclosed herein are not to be interpreted as limiting but merely as a representative basis for teaching one skilled in the art to variously employ the methods and structures of the present disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the disclosed structures and methods, as oriented in the drawing figures. The terms "overlying," "atop," "on," "positioned on," or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating, or semiconductor layers at the interface of the two elements.

Some embodiments of the present invention recognize that a strained silicon-germanium (SiGe) channel is a great pFET candidate for high-performance complementary metal-oxide-semiconductor (CMOS), particularly in a FinFET (field-effect transistor) architecture. Increasing the germanium (Ge) content in channel SiGe can offer an increased benefit for use in a FET due to lower effective mass and strain; however, process temperature constraints, high-K passivation difficulties, and high off-state leakage can occur. Additional embodiments of the invention recognize that low-Ge content SiGe (e.g., 25-30% Ge content) has a wider band gap and higher thermal stability; and thus, can have lower leakage. Further, embodiments of the invention recognize that aggressively straining SiGe with relatively low Ge content may preserve some of the benefits of a SiGe channel with a high Ge content. Stated differently, an aggressively strained SiGe channel with a relatively low Ge content may perform similarly to a SiGe channel having a relatively high Ge content while simultaneously reducing the off-state leakage.

Embodiments of the present invention allow for a FET structure with aggressively strained low-Ge content SiGe that is lattice matched to a relaxed carbon-doped silicon (Si:C) structure (e.g., carbon content of 0.2%-4%, with 0.5%-2.5% preferred).

Embodiments of the present invention will now be described in detail with reference to the Figures. FIG. 1 is a functional block diagram illustrating fabrication process 100, an exemplary method for fabricating a FET, in accordance with an embodiment of the present invention.

In step 102, fabrication process 100 forms a shallow trench isolation (STI) structure with oxide walled aspect ratio trapping (ART) trenches. In one embodiment, fabrication process 100 forms a STI structure that includes oxide fins that form walled ART trenches on a substrate (e.g., STI structure on a substrate). In an alternative embodiment, fabrication process 100 forms a STI structure that includes nitride fins that form walled ART trenches on a substrate (e.g., STI structure on a substrate). In an example embodiment, fabrication process 100 starts with a bulk silicon wafer (e.g., bulk silicon substrate), deposits oxide on the silicon, deposits a mask on portions of the oxide, and recesses the deposited oxide down to expose the underlying silicon, which results in a STI structure with oxide walled ART trenches. In another example embodiment, fabrication process 100 starts with a bulk silicon wafer (e.g., bulk silicon substrate), deposits a mask on portions of the silicon, recesses the unmasked portions of the silicon, removes the mask, fills the recessed portions of the silicon with oxide, performs Chemical Mechanical Polishing (CMP), and recesses one or more of the silicon fins, which results in a STI structure with oxide walled ART trenches. In various embodiments, the formed STI structure includes a pattern of a plurality of ART trenches on the substrate, which are defined by walls of a dielectric material (e.g., silicon dioxide ($SiO_2$), another oxide, a nitride, etc.). In additional embodiments, ART can be used to achieve a FET structure, and relaxed Si or ART SiGe below a strained Si fin are potential candidates for nFET.

Figure 2A:
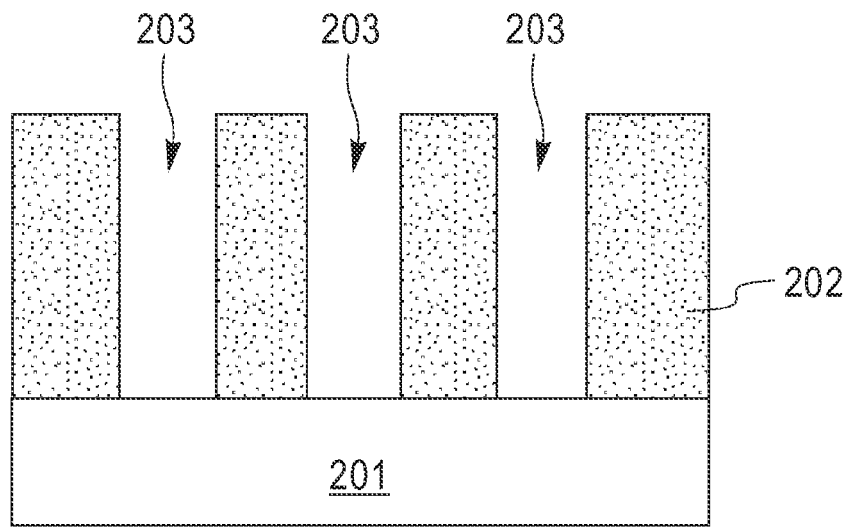
FIG. 2A depicts a cross-sectional view of a FET structure that includes a STI formation, in accordance with embodiments of the present invention.

In an example, fabrication process 100 forms FET 200 (depicted in FIG. 2A), which is a FET structure that includes a STI structure with oxide walled ART trenches 203 (e.g., a STI formation). FET 200 includes substrate 201 and oxide 202. The STI structure of FET 200 includes a plurality of patterned ART trenches, such as ART trenches 203, on substrate 201 that are defined by oxide 202, which forms the side walls of ART trenches 203. In one embodiment, oxide 202 is a series of oxide structures (e.g., oxide fins) that form walled ART trenches 203 of the STI structure in FET 200. In an example embodiment, FET 200 depicts a portion of the STI structure (e.g., a portion that can become the pFET of a FET structure), and another portion (not shown) of the STI structure (e.g., portion that can become the nFET of a FET structure) is covered by a hard mask. In various embodiments, the hard mask can be silicon nitride (SiN), deposited using, for example, low pressure chemical vapor deposition (LPCVD). The hard mask can be any hard mask material that can act as an etch mask during the patterning of substrate 201 and oxide 202 (e.g., a nitride, oxide/nitride stack, silicon nitride, silicon dioxide, silicon oxynitride, etc.), as described in further detail in fabrication process 100. ART trenches 203, which are defined by oxide walls (e.g., oxide 202), form the STI structure on substrate 201.

Substrate 201 employed in the present invention may include any semiconductor material including, but not limited to: un-doped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Substrate 201 may also include an organic semiconductor or a layered semiconductor such as Si/SiGe, a silicon-on-insulator (SOI) or a SiGe-on-insulator (SGOI). In additional embodiments, substrate 201 contains a dielectric coating over the bulk semiconductor to isolate the source/drain/gate metals. The dielectric coating can be $SiO_2$ (thermal, plasma-enhanced chemical vapor deposition (PECVD), (low temperature oxide (LTO)), $Al_2O_3$, or $HfO_2$ (e.g., atomic layer deposition (ALD) deposited), $Si_3N_4$ (silicon nitride), etc. In another embodiment, substrate 201 is a sapphire substrate (e.g., $Al_2O_3$ bulk). In various embodiments, oxide 202 can be a dielectric material, such as $SiO_2$ or Si-nitride.

In step 104, fabrication process 100 grows Si:C. In one embodiment, fabrication process 100 grows relaxed Si:C in ART trenches of the STI structure (from step 102). In an example embodiment, fabrication process 100 grows the Si:C utilizing selective epitaxy up from the bottom (e.g., silicon forms the bottom of the trenches) of the recessed ART trenches of the STI structure. In other embodiments, fabrication process 100 can utilize various other forms of epitaxial growth.

Figure 2B:
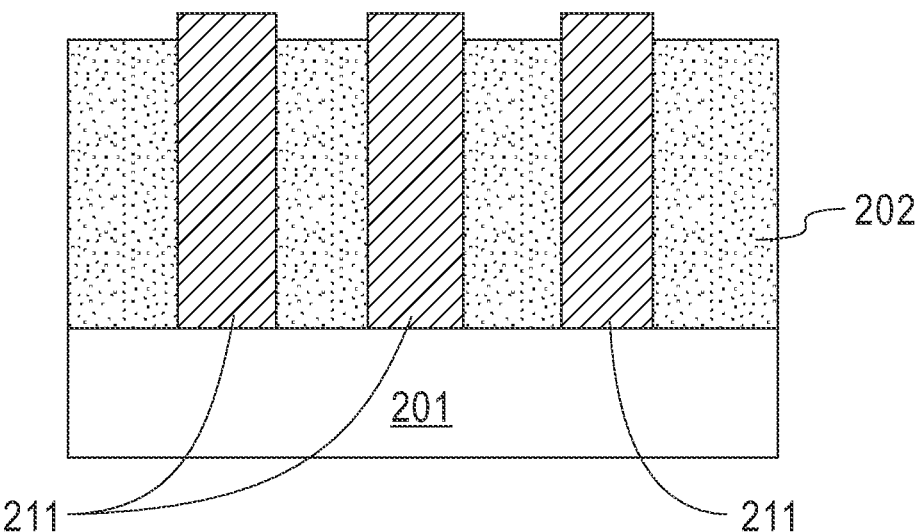
FIG. 2B depicts a cross-sectional view of a FET structure with carbon doped silicon (Si:C) fins grown in trenches of the STI formation of FIG. 2A, in accordance with embodiments of the present invention.

In an example, fabrication process 100 grows Si:C fins 211 in ART trenches 203 (of FET 200), forming FET 210 (depicted in FIG. 2B). In one embodiment, Si:C fins 211 are comprised of relaxed Si:C, which are grown on substrate 201 utilizing selective epitaxy.

In step 106, fabrication process 100 performs CMP and recesses the Si:C. In one embodiment, fabrication process 100 recesses the Si:C (grown in step 104) and performs CMP to form uniform surfaces in the STI structure of the FET. CMP (also referred to as Chemical Mechanical Planarization) utilizes a combination of chemical and mechanical forces to smooth a surface (e.g., a hybrid of chemical etching and abrasive-free polishing). In another embodiment, fabrication process 100 recesses the Si:C utilizing reactive-ion etching (RIE) or other lithography and etching techniques to form a recessed surface, such as other forms of dry etching, chlorine-based RIE chemistry, Argon (Ar) milling, etc.

Figure 2C:
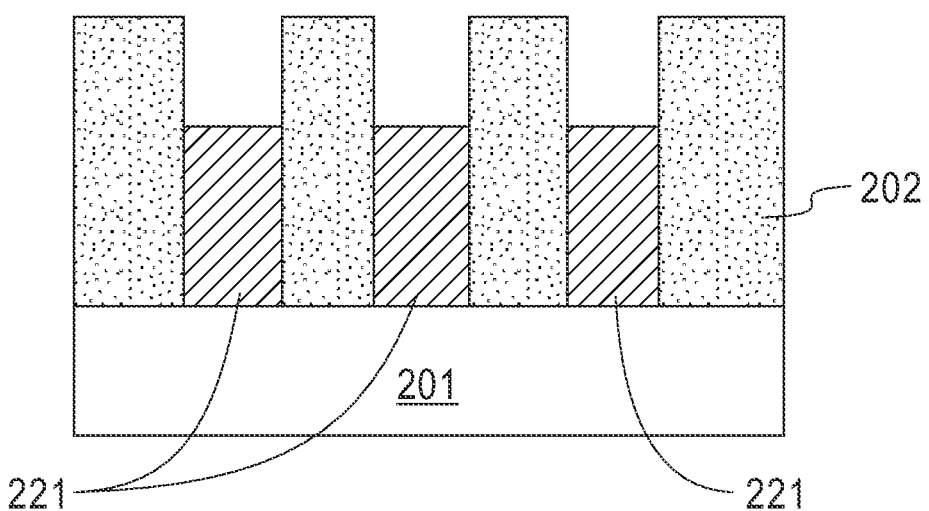
FIG. 2C depicts a cross-sectional view of a FET structure with a recess on the Si:C fins of FIG. 2B, in accordance with embodiments of the present invention.

In an example, fabrication process 100 performs CMP on FET 210 (e.g., to smooth the surfaces) and etches Si:C fins 211 of FET 210, which forms etched Si:C fins 211 in FET 220 (depicted in FIG. 2C). FET 220 includes etched Si:C fins 221, which are relaxed Si:C fins.

In step 108, fabrication process 100 epitaxially grows SiGe. In one embodiment, fabrication process 100 grows SiGe on the recessed Si:C (recessed in step 108) of the ART trenches of the STI structure. In an example embodiment, fabrication process 100 grows aggressively strained SiGe that has low-Ge content utilizing selective epitaxy (e.g., approximately 25% Ge). For example, fabrication process 100 grows 30% Ge content SiGe on relaxed 1% carbon content Si:C. Fabrication process 100 grows SiGe in the ART trenches of the STI structure, which forms SiGe fins on the Si:C fins (grown in step 106).

Figure 3A:
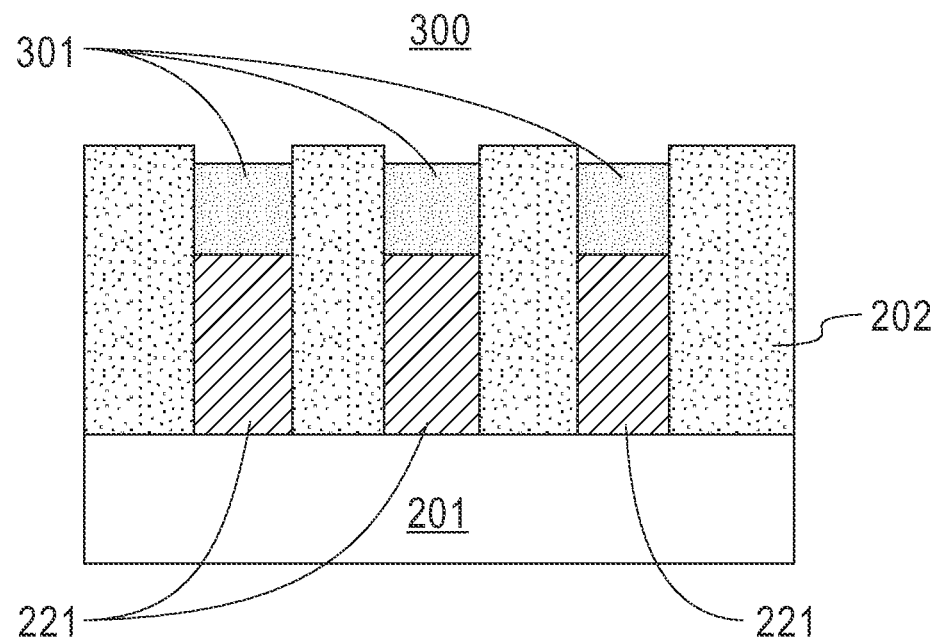
FIG. 3A depicts a cross-sectional view of a FET structure with silicon-germanium (SiGe) fins grown on the recessed Si:C fins of FIG. 2C, in accordance with embodiments of the present invention.

In an example, fabrication process 100 grows SiGe fins on etched Si:C fins 221 of FET 220. In this example, fabrication process 100 grows SiGe fins 301 on etched Si:C fins 221, forming FET 300 (depicted in FIG. 3A). In an example embodiment, SiGe fins 301 are aggressively strained low-Ge content SiGe that are grown on etched Si:C fins 221, which are strain relaxed Si:C.

In step 110, fabrication process 100 etches the oxide to expose the SiGe fins. In one embodiment, fabrication process 100 etches, or recesses, the oxide of the structure, resulting in exposing the SiGe fins grown in step 108. In an example embodiment, fabrication process 100 utilizes a selective RIE to etch the oxide and expose the SiGe fins. In another example embodiment, fabrication process 100 utilizes a wet etching process to recess the oxide and expose the SiGe fins.

Figure 3B:
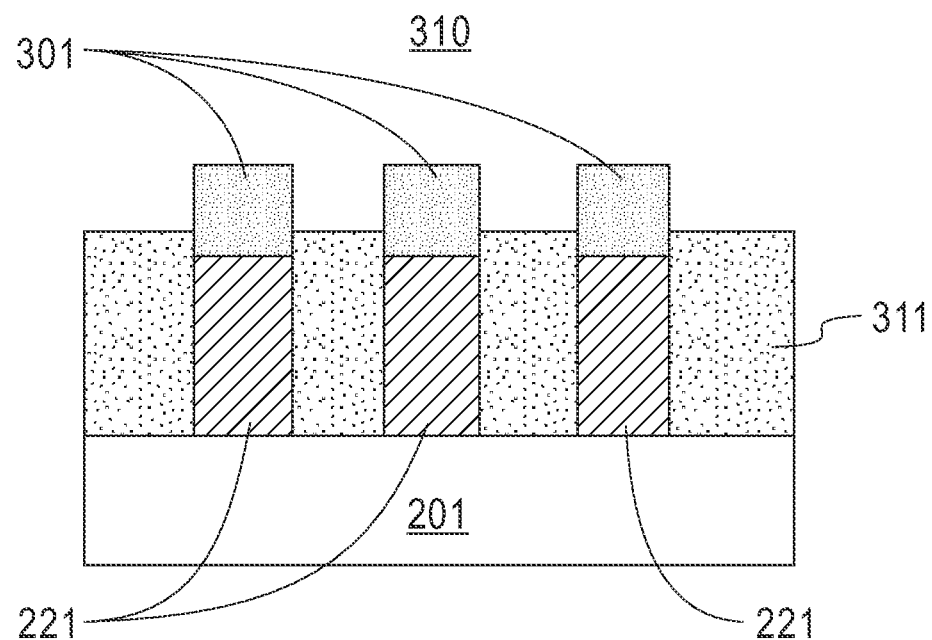
FIG. 3B depicts a cross-sectional view of a FET structure after recessing the oxide of the STI formation of FIG. 3A, exposing at least a portion of the SiGe fins, in accordance with embodiments of the present invention.

In an example, fabrication process 100 etches oxide 202 of FET 300, which exposes SiGe fins 301. FET 310 (depicted in FIG. 3B) includes recessed oxide 311, which fabrication process has etched to expose at least a portion of SiGe fins 301 above recessed oxide 311. In an additional embodiment, FET 310 can continue through other semiconductor fabrication processes (e.g., low-temperature processing or other finFET processing methods). In another embodiment, fabrication process 100 removed the hard mask (deposited in step 102) prior to step 110.

Figure 4:
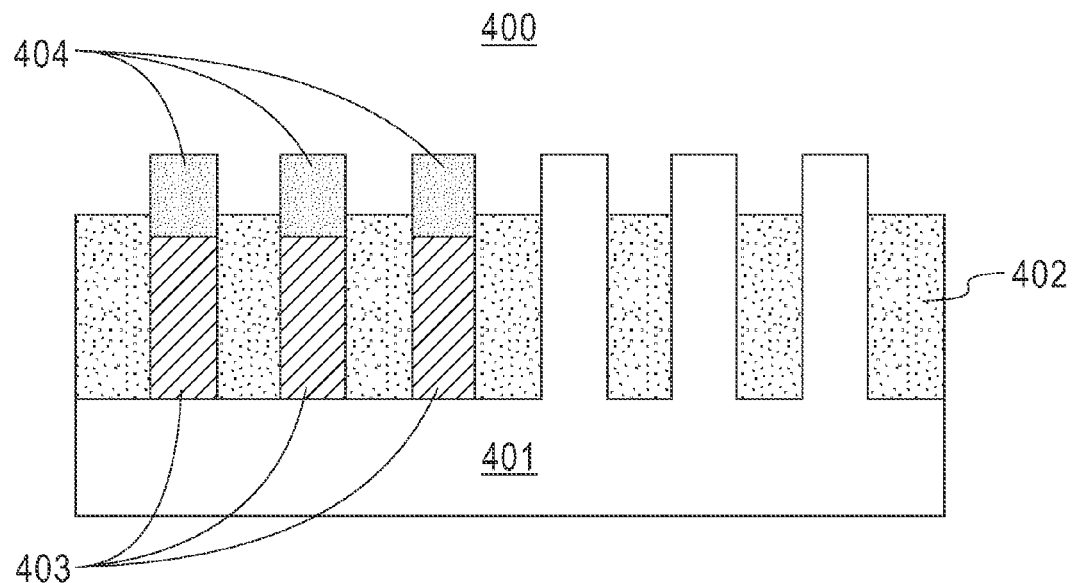
FIG. 4 depicts a cross-sectional view of an example FET structure that includes a STI formation that includes a plurality of fins comprised of Si:C and SiGe and a plurality of fins comprised of Si, in accordance with embodiments of the present invention.

FIG. 4 depicts FET 400, which is an example FET structure that includes a STI/ART formation. In one embodiment, FET 400 is fabricated utilizing the processing steps of fabrication process 100. FET 400 includes substrate 401, recessed oxide 402, Si:C fins 403, and SiGe fins 404. In one embodiment, Si:C fins 403 and SiGe fins 404 represent a p-type region of FET 400, and Si fins of substrate 401 represents an n-type region of FET 400 in which n-type semiconductor devices may be subsequently formed. In an example, Si:C fins 403 are relaxed Si:C, and SiGe fins 404 are aggressively strained low-Ge content SiGe. In this example, the relaxed Si:C fins (e.g., Si:C fins 403) can have a −0.8% lattice mismatch with Si (of substrate 401), the SiGe fins (e.g., SiGe fins 404) can be comprised of SiGe of content $Si_{0.7}Ge_{0.3}$ with a +1.2% larger lattice, and the SiGe fins are grown on the Si:C fins with −2% strain.

Figure 5:
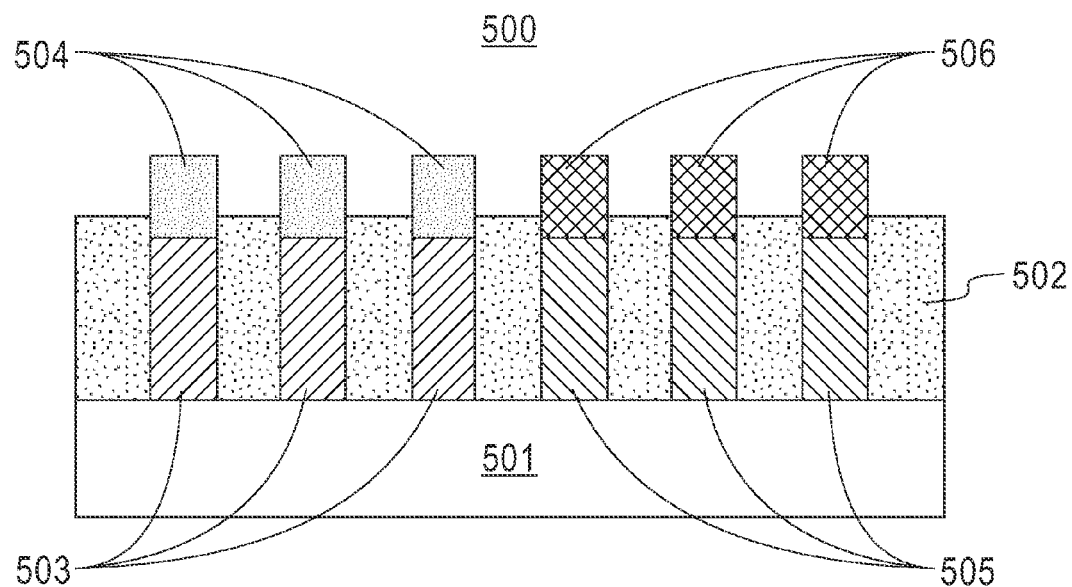
FIG. 5 depicts a cross-sectional view of an example FET structure that includes a STI formation a plurality of fins comprised of Si:C and SiGe and a plurality of fins comprised of SiGe and Si, in accordance with an alternative embodiment of the present invention.

FIG. 5 depicts FET 500, which is an example FET structure that includes a STI/ART formation. FET 500 includes substrate 501, recessed oxide 502, Si:C fins 503, SiGe fins 504, SiGe fins 505, and Si fins 506. In one embodiment, FET 500 is fabricated utilizing the processing steps of fabrication process 100 along with additional fabrication steps to form SiGe fins 505 and Si fins 506 in the ART trenches (e.g., ART trenches 203 in FIG. 2A). In an example embodiment, the structures of SiGe fins 504 on Si:C fins 503 represent a p-type region of FET 500, and the structures of SiGe fins 505 and Si fins 506 represent an n-type region of FET 500. Si:C fins 503 and SiGe fins 505 are grown on substrate 501, in trenches between oxide structures (e.g., fins) of a STI structure on FET 500, utilizing selective epitaxy. SiGe fins 504 are grown (via selective epitaxy) on top of Si:C fins 503. Si fins 506 are grown (via selective epitaxy) on top of SiGe fins 505. The oxide portions of the ART trench structures of FET 500 is recessed to form recessed oxide 502, which results in a STI structure on FET 500 that exposes at least a portion of SiGe fins 505 and Si fins 506. In an example embodiment, Si:C fins 503 are relaxed Si:C, and SiGe fins 504 are aggressively strained low-Ge content SiGe. In another example embodiment, SiGe fins 505 are strain-relaxed SiGe, and Si fins 506 are strained Si.

What is claimed is:

1. A method for fabricating a field-effect transistor (FET), the method comprising:
    forming a shallow trench isolation (STI) structure on a semiconductor substrate, wherein the STI structure includes dielectric structures on the semiconductor substrate that form one or more dielectric walled aspect ratio trapping (ART) trenches;
    epitaxially growing a first semiconductor material on the semiconductor substrate and substantially filling at least one of the one or more dielectric walled ART trenches such that an upper surface of the first semiconductor material is substantially flush with an upper surface of the dielectric structures, wherein the first semiconductor material is carbon doped silicon (Si:C);
    recessing the first semiconductor material down into the one or more dielectric walled ART trenches selective to the dielectric structures, such that the upper surface of the first semiconductor material is below the upper surface of the dielectric structures; and
    epitaxially growing a second semiconductor material on the upper surface of the first semiconductor material and substantially filling the one or more dielectric walled ART trenches to form a semiconductor fin that comprises an upper portion comprised of the second semiconductor material and a lower portion comprised of the first semiconductor material.

2. The method of claim 1, further comprising:
    etching down the dielectric structures to expose at least a portion of a sidewall of the upper portion of the semiconductor fin.

3. The method of claim 1, wherein forming a shallow trench isolation (STI) structure on a semiconductor substrate, further comprises:
    depositing a layer of dielectric on the semiconductor substrate; and
    recessing an exposed portion of the deposited dielectric down to the semiconductor substrate to form the STI structure that includes one or more dielectric walled ART trenches.

4. The method of claim 1, wherein the dielectric structures that form one or more dielectric walled ART trenches comprise, an oxide, a nitride, or some combination thereof.

5. The method of claim 1, wherein recessing the first semiconductor material down into the one or more dielectric walled ART trenches, further comprises:
    recessing the first semiconductor material down into the one or more ART trenches utilizing reactive-ion etching (RIE).

6. The method of claim 1, wherein the second semiconductor material is silicon-germanium (SiGe).

7. The method of claim 1, wherein the second semiconductor material is aggressively strained silicon-germanium (SiGe) that has low germanium (Ge) content.

8. The method of claim 1, further comprising:
   epitaxially growing a third semiconductor material on the semiconductor substrate and substantially filling at least one of the one or more dielectric walled ART trenches such that an upper surface of the third semiconductor material is substantially flush with an upper surface of the dielectric structures;
   recessing the third semiconductor material down into the one or more dielectric walled ART trenches selective to the dielectric structures, such that the upper surface of the third semiconductor material is below the upper surface of the dielectric structures; and
   epitaxially growing a fourth semiconductor material on the upper surface of the third semiconductor material and substantially filling the one or more dielectric walled ART trenches to form a semiconductor fin that comprises an upper portion comprised of the fourth semiconductor material and a lower portion comprised of the third semiconductor material.

9. The method of claim 8, wherein the third semiconductor material is strain relaxed silicon-germanium (SiGe).

10. The method of claim 8, wherein the fourth semiconductor material is strained silicon (Si).

11. A field-effect transistor (FET) structure, comprising:
    a set of two oxide structures on a semiconductor substrate;
    a fin on the semiconductor substrate between the set of two oxide structures;
    wherein the fin is comprised of a lower portion comprised of a first semiconductor material on the semiconductor substrate, wherein the first semiconductor material is carbon doped silicon (Si:C); and
    wherein the fin is comprised of an upper portion comprised of a second semiconductor material on the first semiconductor material lower portion.

12. The FET structure of claim 11, wherein the second semiconductor material is silicon-germanium (SiGe).

13. The FET structure of claim 11, wherein the second semiconductor material is aggressively strained silicon-germanium (SiGe) that has low germanium (Ge) content.

14. The FET structure of claim 11, wherein at least a portion of a sidewall of the upper portion of the fin is exposed above the set of two oxide structures.

15. The FET structure of claim 11, further comprising:
    a second set of two oxide structures on the semiconductor substrate;
    a second fin on the semiconductor substrate between the second set of two oxide structures;
    wherein the fin is comprised of a lower portion comprised of a third semiconductor material on the semiconductor substrate; and
    wherein the fin is comprised of an upper portion comprised of a fourth semiconductor material on the third semiconductor material lower portion.

16. The FET structure of claim 15, wherein the third semiconductor material is strain relaxed silicon-germanium (SiGe).

17. The FET structure of claim 15, wherein the fourth semiconductor material is strained silicon (Si).

18. The FET structure of claim 15, wherein at least a portion of the upper portion of the second fin is exposed above the second set of two oxide structures.

* * * * *